United States Patent [19]

Sacherman

[11] Patent Number: 5,587,889

[45] Date of Patent: Dec. 24, 1996

[54] EDGE CONNECTOR FOR SECURING A MOUNTABLE ELECTRONIC COMPONENT TO A DEVICE WITH RECEIVING APERTURES FOR EDGE CONNECTOR

[76] Inventor: Jim Sacherman, 446 Ruthven, Palo Alto, Calif. 94301

[21] Appl. No.: 243,967

[22] Filed: May 17, 1994

[51] Int. Cl.⁶ ........................................................ H05K 7/14
[52] U.S. Cl. ........................... 361/809; 361/807; 361/725; 361/727
[58] Field of Search ............................ 174/138 D, 138 E; 224/250, 318, 902, 909; 24/301, 300; 411/2, 96–98, 117; 361/807, 809, 810, 825, 685, 725, 727; 312/298, 317.1, 334.1

[56] References Cited

FOREIGN PATENT DOCUMENTS 0270065 6/1988 European Pat. Off. ............... 361/756

OTHER PUBLICATIONS

Eaton Brochure "Tinnerman Brand Fasteners" 1987.

*Primary Examiner*—Donald A. Sparks
*Attorney, Agent, or Firm*—Haverstock & Associates

[57] ABSTRACT

The present invention relates to an improved apparatus and screwless method for rack mounting an independent rail to a peripheral electronic component or primary rail. First, a spring-urged elongated arch having a convex surface and a concave surface is engaged by depressing the convex surface, the arch further having an engaged state and disengaged state, two legs, each of the legs being placed at an opposite end of the concave surface and angled inward of the arch. Second, the two legs are individually directed through two apertures in the independent rail. Third, the two legs are subsequently directed into two apertures in the peripheral electronic component. Finally, when the convex surface is released, the two legs retract and clamp the peripheral electronic component within the apertures of the peripheral electronic component.

6 Claims, 6 Drawing Sheets

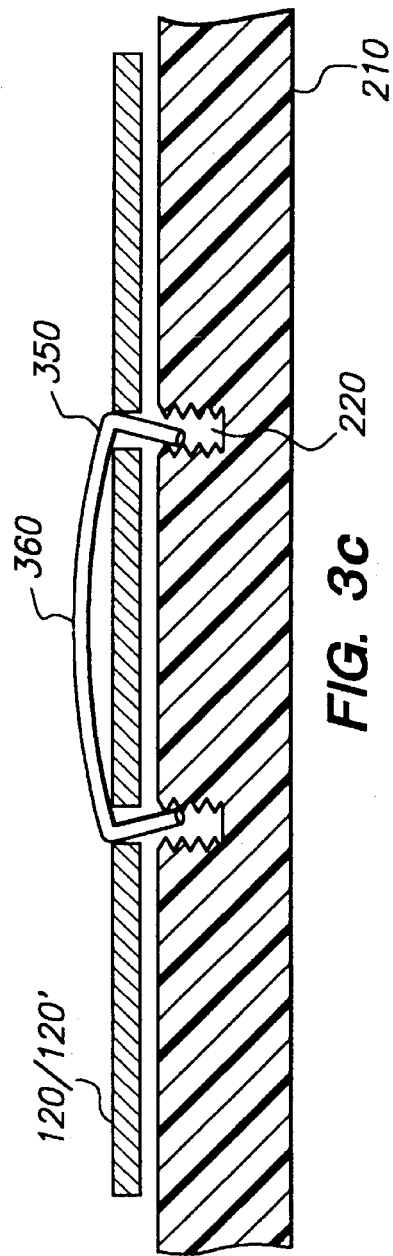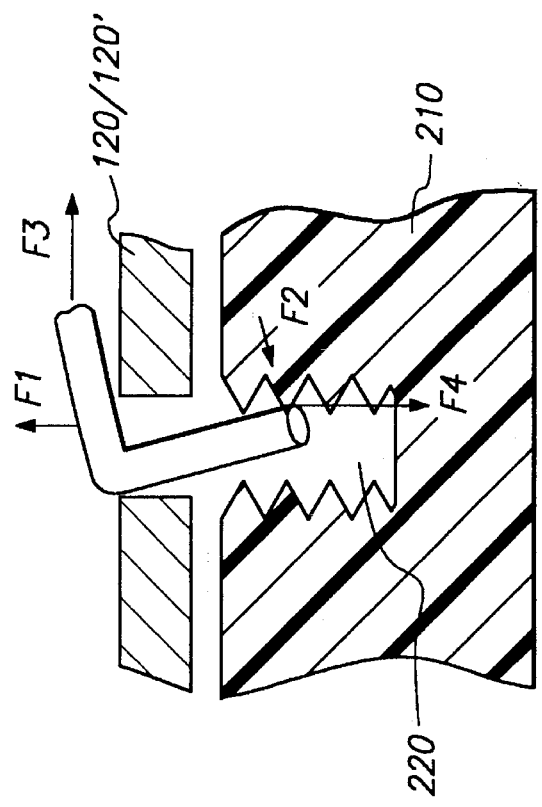

5,587,889

1

EDGE CONNECTOR FOR SECURING A MOUNTABLE ELECTRONIC COMPONENT TO A DEVICE WITH RECEIVING APERTURES FOR EDGE CONNECTOR

FIELD OF THE INVENTION

This invention relates to the field of rack mounted electronic components. More particularly, this invention relates to an improved means for mounting and grounding a peripheral electronic component to an electronic system.

BACKGROUND OF THE INVENTION

A peripheral electronic component, such as a computer disk drive or a removable car radio, is rack mounted to an electronic system, such as a car stereo system, using interlocking rails. FIG. 1(a) depicts a set of interlocking rails or carriers. Referring to FIG. 1(a), each set of interlocking rails comprises a primary rail 110 and an independent rail 120. FIG. 1(b) depicts the relationship between the primary rail 110 and the independent rail 120. Referring to FIG. 1(b), the independent rail 120 can easily be attached to and removed from the primary rail 110. Two primary rails, one for each side of the electronic system, are attached to the electronic system, e.g. the car stereo system. Two independent rails, one for each side of the peripheral electronic component, are attached to the peripheral electronic component, e.g. the removable car radio. The peripheral electronic component can then be manipulated so that the independent rails attach to the primary rails, thereby securely connecting the component to the system.

FIG. 1(c) shows an alternate embodiment of the rails in the prior art. The corresponding elements are identified with prime reference numerals.

FIG. 2(a) is a perspective view of a typical way to connect an independent rail 120 to a peripheral electronic component 210. Referring to FIG. 2(a), the conventional method for attaching an independent rail 120 to a peripheral electronic component 210 is to feed screws 250 through second apertures 240 in the independent rail 120, and then screw the screws 250 into screw holes 220 in the chassis of the peripheral electronic component 210. However, this method proves costly and time consuming. It will be apparent to one of ordinary skill in the art that the rails of FIG. 1(a) can be substituted by those of FIG. 1(c).

FIG. 2(b) shows a perspective view of a prior art carrier 122 for mounting a peripheral electronic component 210. The carrier 122 is mounted to the component with screws 250. AS with the rail system described above, the use of screws 250 with the carrier system also is costly due to the time that must be expended attaching the screws 250.

SUMMARY OF THE INVENTION

The present invention relates to an improved apparatus and screwless method for rack mounting an independent rail or carrier to a peripheral electronic component or primary rail. First, a spring-urged elongated arch having a convex surface and a concave surface is provided. The arch having an engaged and disengaged state, further has two legs, each leg placed at an opposite end of the concave surface and angled inward of the arch. Second, the arch is engaged by depressing the convex surface of the arch. Third, the two legs are individually directed through two apertures in the independent rail. Fourth, the two legs are subsequently directed into two apertures in the peripheral electronic component. Finally, when the arch is released, the two legs retract and clamp the peripheral electronic component within the apertures of the peripheral electronic component.

BRIEF DESCRIPTION OF THE DRAWINGS

FIG. 3(c) is a cross sectional view of an edge connector in engagement for holding a peripheral electronic component.

FIG. 3(d) is a cross sectional close-up view of a portion of the edge connector of FIG. 3(c).

DETAILED DESCRIPTION OF THE PREFERRED EMBODIMENT

The following description of the preferred embodiment is not intended to limit the scope of the present invention.

Figure 3A:
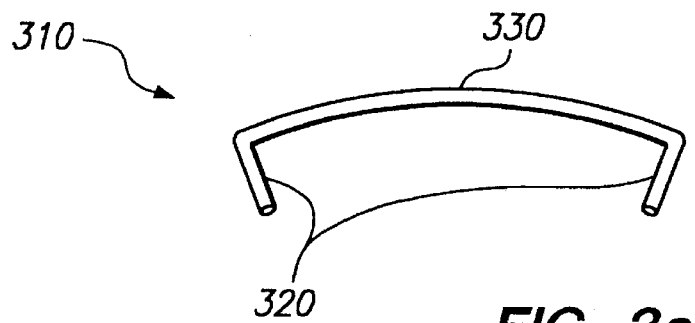
FIG. 3(a) is a perspective view of an edge connector when disengaged.

FIG. 3(a) is a perspective view of the edge connector 310 when disengaged. Referring to FIG. 3(a), the edge connector 310 for a rack mounted peripheral electronic component comprises an elongated convex-concave arch 330 and two legs 320. The edge connector 310 is fabricated with an electrically conductive material having elastic characteristics when depressed on the convex surface of the arch. Each leg 320 is placed at an opposite end on the concave surface of the arch and at an angle inward of the arch.

Figure 3B:
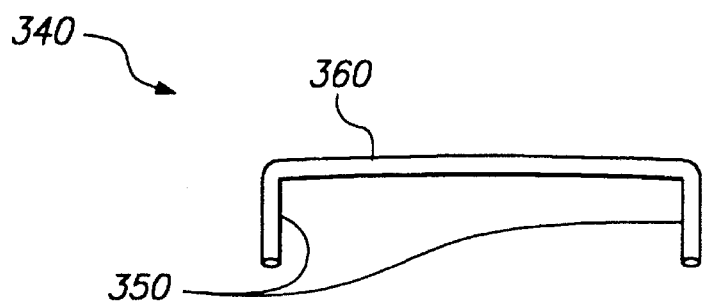
FIG. 3(b) is a perspective view of an edge connector when the edge connector is depressed on the convex surface of the arch.

FIG. 3(b) depicts a perspective view of an edge connector 340 when the edge connector 340 is depressed on the convex surface of the arch. Referring to FIG. 3(b), when the arch 360 is depressed on the convex surface of the arch, thereby forcing the arch 360 to a more linear state, the legs 350 separate. When the arch 360 is released, the spring resilience of the edge connector causes it to attempt to resume its original shape, as depicted in FIG. 3(a). Thus, the two legs 320 clamp any object placed therebetween.

Figure 1A:
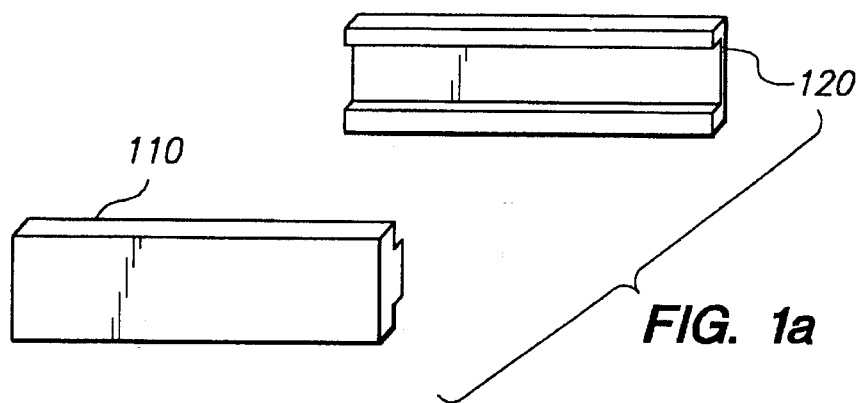
FIG. 1(a) is a first perspective view of an interlocking rail.
Figure 1B:
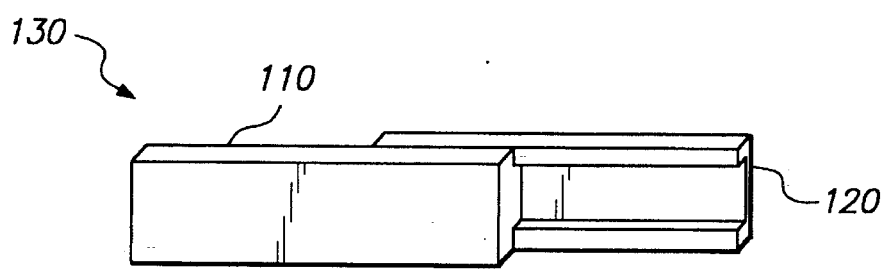
FIG. 1(b) is a second perspective view of an interlocking rail.
Figure 1C:
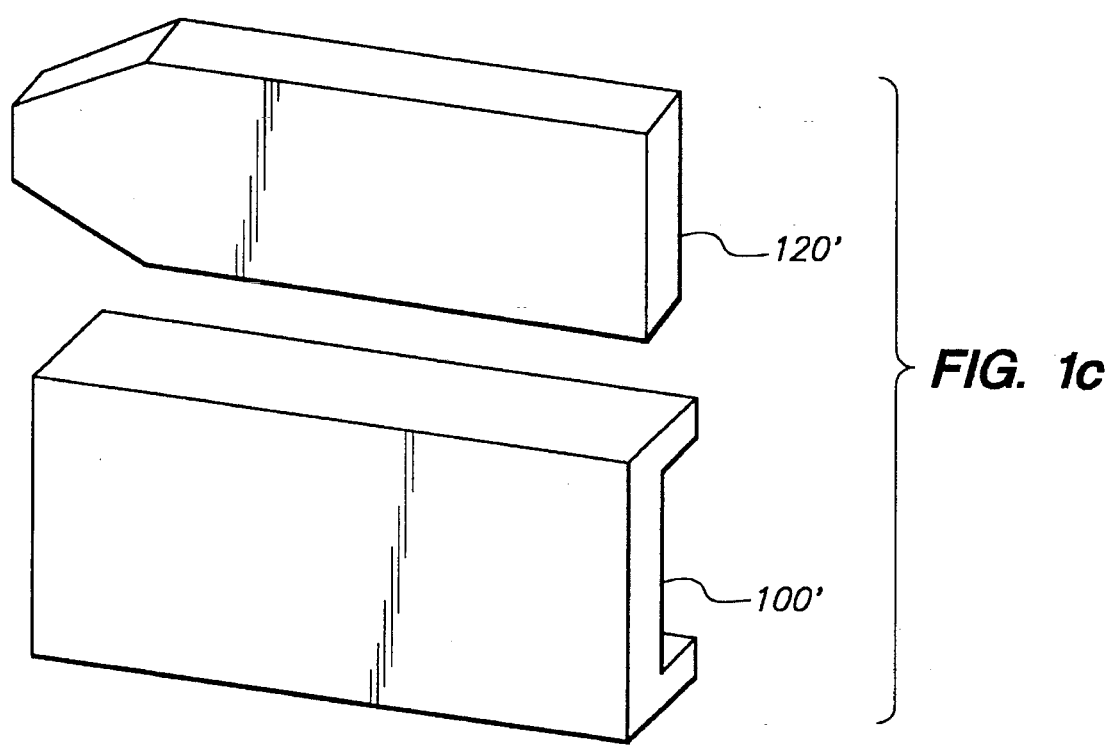
FIG. 1(c) shows an alternate embodiment of the interlocking rails of the prior art.
Figure 2A:
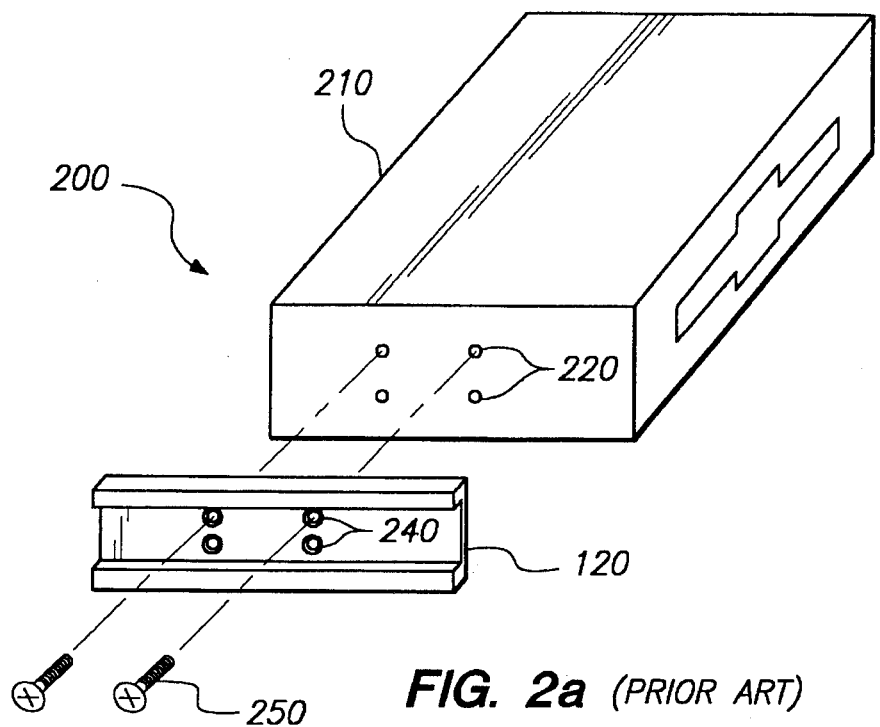
FIG. 2(a) is a perspective view of a typical way to connect an independent rail to a peripheral electronic component in the prior art.
Figure 4B:
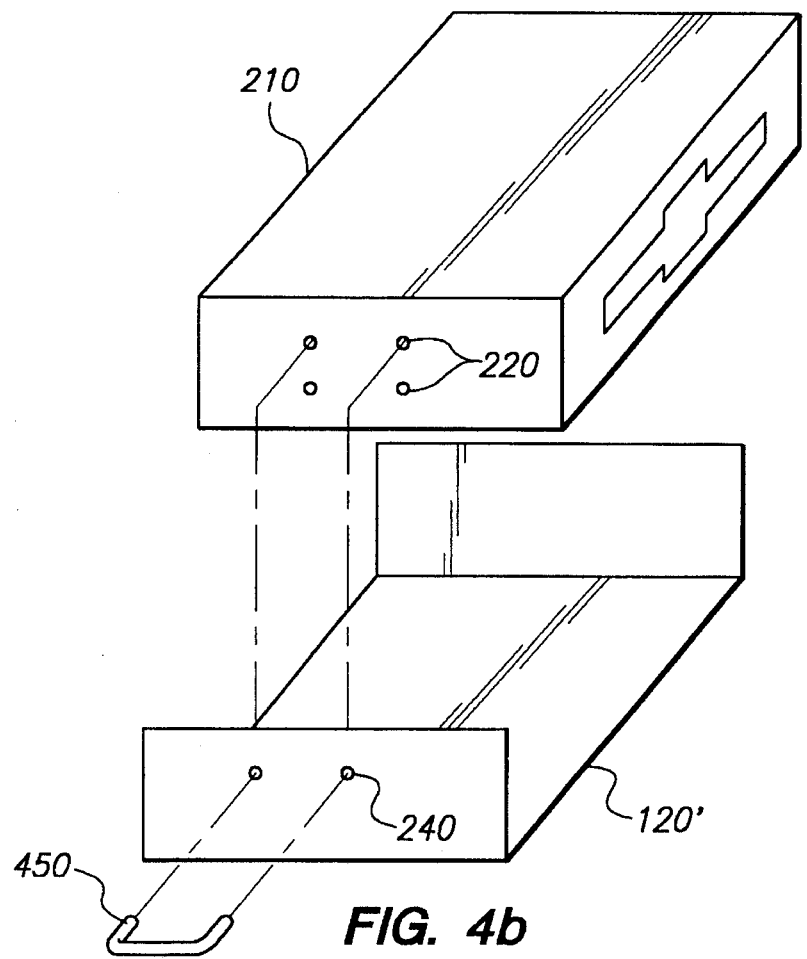
FIG. 4(b) is a perspective view of an edge connector in relation to a carrier for mounting a peripheral electronic component.
Figure 2B:
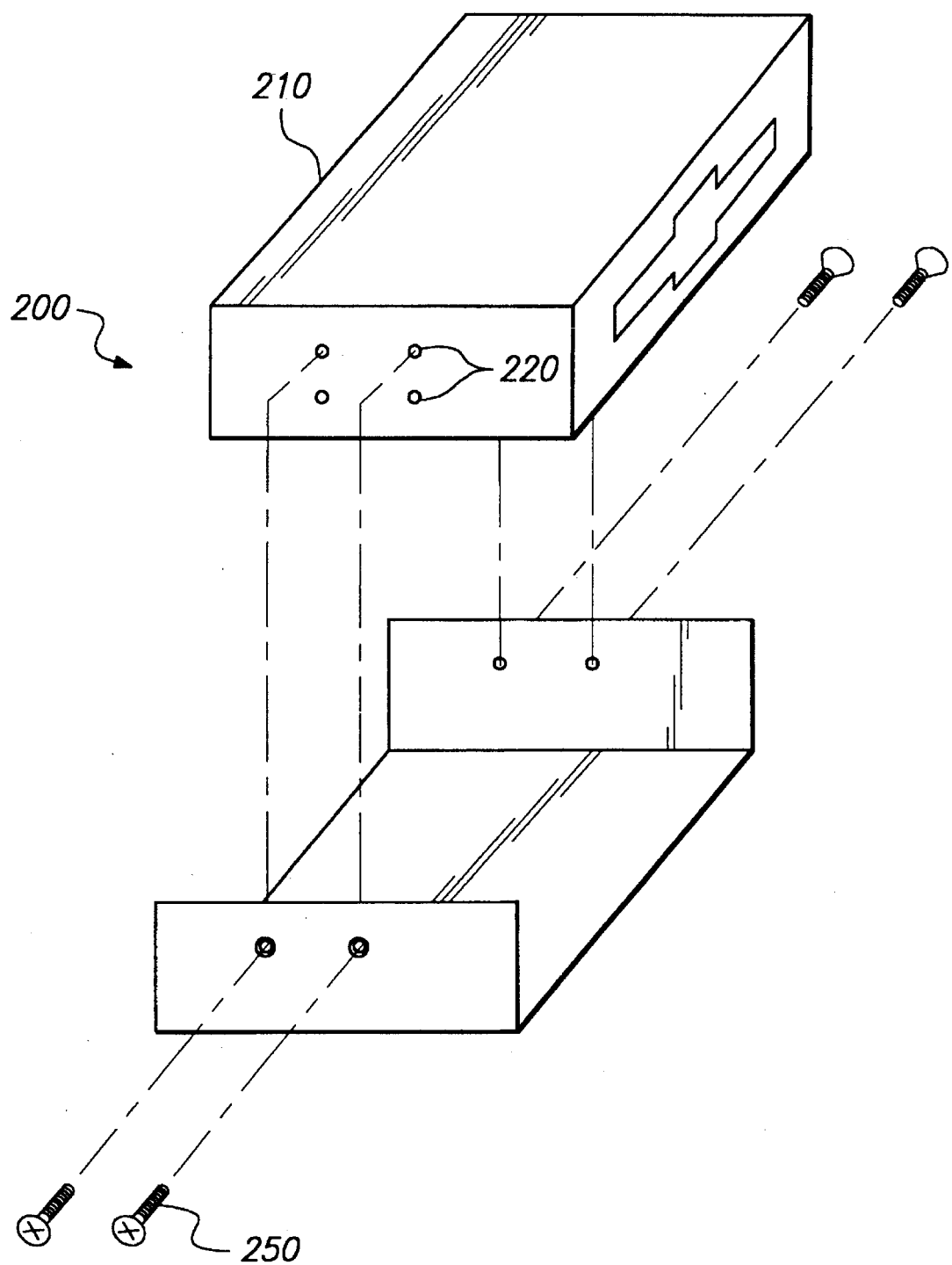
FIG. 2(b) is a perspective view of a typical carrier for connecting a peripheral electronic component in the prior art.
Figure 4A:
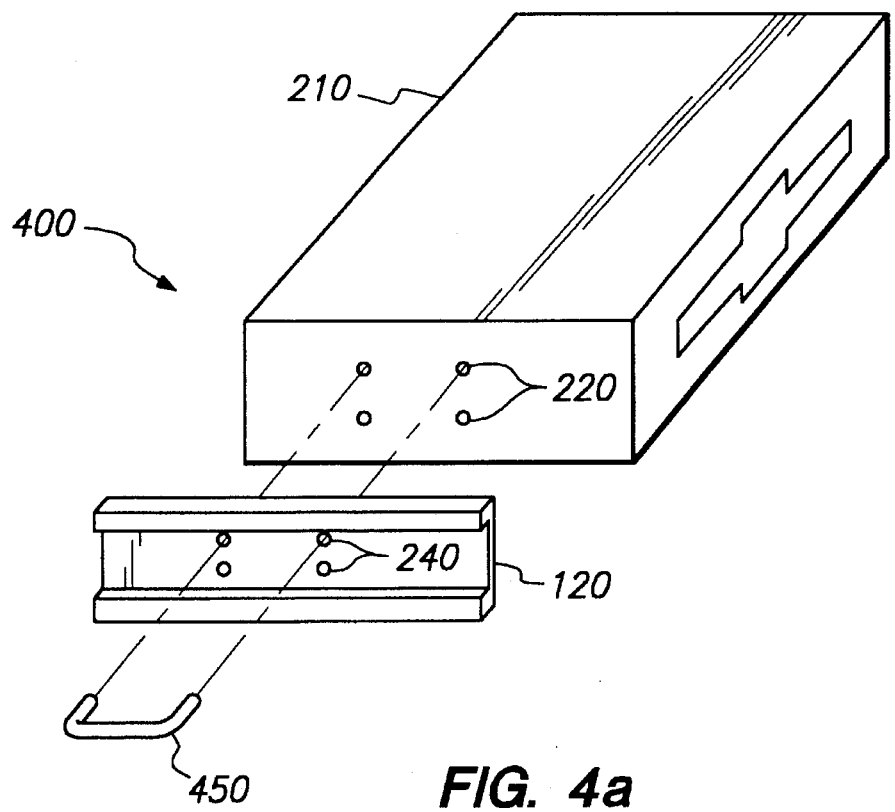
FIG. 4(a) is a perspective view of an edge connector in relation to an independent rail and a peripheral electronic component.

FIG. 4(a) is a perspective view of an edge connector 450 in relation to an independent rail 120 and a peripheral electronic component 210. Referring to FIG. 4, the edge connector 450 provides a preferred method for mounting an independent rail 120 to a peripheral electronic component 210. As previously discussed in reference to FIG. 3(b), when the convex surface of the arch of edge connector 450 is depressed, the legs separate. While the legs are separate, the legs are individually directed through two apertures 240 in the independent rail 120. While the legs are still separate, each of the legs are subsequently directed into two apertures 220 in the peripheral electronic component 210. Finally, the arch is released. As previously discussed in reference to FIG. 3(a), the two legs retract and clamp the peripheral electronic component within the apertures 220. FIG. 3(c) and 3(d) show the legs 350 of the edge connector in operative disengagement with a hole 220 of the peripheral electronic component 210. The slightly canted legs 350 contact the threads of the hole. The force F1 results from any force which would ordinarily separate the peripheral electronic component 210 from the rail 120 or the carrier 120'. The force F2 is counteracted by the force F3 of the spring. The threads are likely to slightly deform the contact face of the arms 350 which also provides a force F4 toward the bottom of the holes 220. The independent rail 120 or the carrier 120' is thereby connected to the peripheral electronic component 210. FIG. 4(b) shows the edge connector 450 coupling the peripheral electronic component 210 to a carrier 120'.

Figure 5:
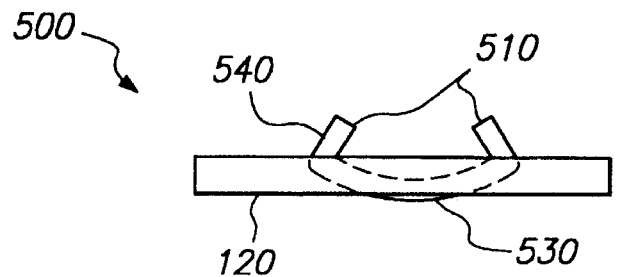
FIG. 5 is a top view of an edge connector and independent rail when placed together and the arch is disengaged.

The edge connector 450 is formed of an electrically conductive material as is the chassis of the peripheral electronic component 210. Once the edge connector 450 is clamped in place it is also electrically coupled to the chassis of the peripheral electronic component 210. FIG. 5 is a top view of an edge connector 540 and independent rail 120 when coupled together and the arch is disengaged. Referring to FIG. 5, because of the original convex-concave shape of the arch, the higher portion of the convex surface 530 of the arch is exposed beyond the independent rail 120. Since the edge connector is fabricated with electrically conductive material, the exposed portion 530 of the arch can be coupled to a ground (not depicted). Therefore, when the legs 510 are placed into the apertures of the peripheral electronic component, as shown in FIG. 4, the chassis of the peripheral electronic component is coupled to ground.

Figure 6A:
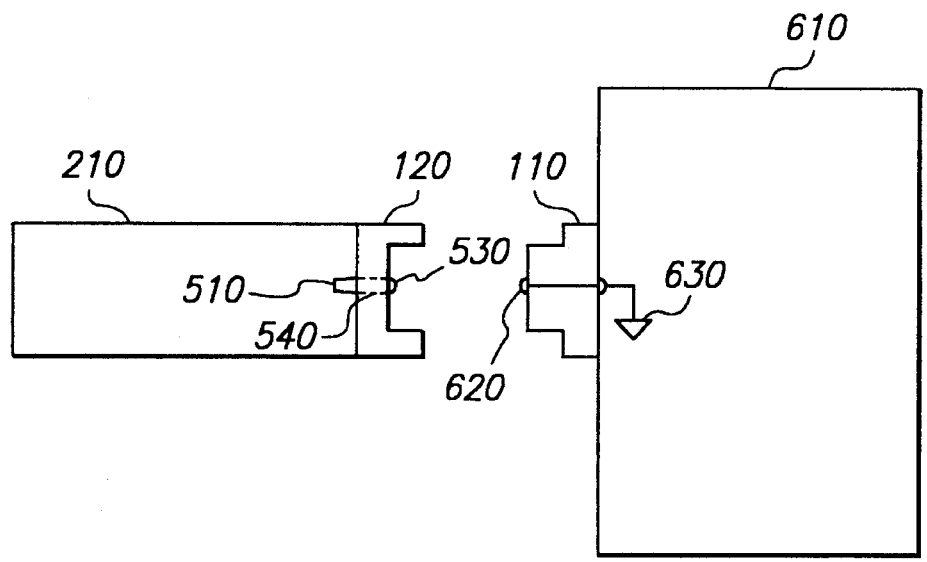
FIG. 6a and 6b are side views of a system for grounding and mounting one side of a peripheral electronic component to an electronic system.

FIG. 6(a) is a side view of a system for grounding and mounting one side of a peripheral electronic component 210 to an electronic system 610. The electronic system 610 has a ground 630. A primary rail 110 has an electrically conductive node 620. The primary rail 110 is coupled to the electronic system 610 using conventional means, and the node 620 is coupled to the ground 630. When an independent rail 120 with an exposed portion 530 is interlocked with the primary rail 110, the exposed portion 530 connects to the node 620. Since the edge connector 540 is fabricated with electrically conductive material, the legs 510 are grounded. Since the legs 510 clamp the chassis of the electronic component 510, the chassis of the electronic component 210 is grounded.

Figure 6B:
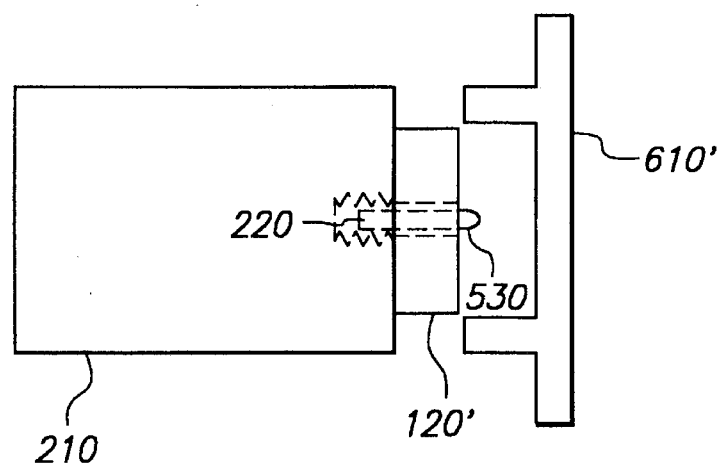

FIG. 6(b) shows a side view of a system for grounding and mounting one side of a peripheral electronic component 210 to a electronic system 610'. The peripheral electronic component 210 includes a rail 120'. The system includes metallic parallel tracks 612 between which the rail 120' slide. As above, this system of mounting effectively grounds the peripheral electronic component to the electronic system 610'.

What is claimed is:

1. An apparatus for rack mounting a peripheral electronic component to an electronic system, said apparatus comprising:

a. a primary rail means coupled to said electronic system;
 b. an independent rail means designed to attach to said primary rail means; and
 c. a screwless clamping means for coupling said independent rail to said peripheral electronic component comprising of:
  an elongated arch having a convex surface and a concave surface, said arch further having an engaged state and a disengaged state, said arch being in the engaged state when the convex surface is depressed, said arch being in the disengaged state when the convex surface is not depressed; and
  two legs for clamping an object placed therebetween, each of said legs being placed at an opposite end of the concave surface and angled inward of said arch, said two legs only clamping when said arch is in the disengaged state.

2. An apparatus for rack mounting a peripheral electronic component to an electronic system, said peripheral electronic component having a chassis and at least two threaded apertures, said electronic system having a ground, said apparatus comprising:

a. a primary rail means coupled to said electronic system;
 b. an independent rail means designed to attach to said primary rail means; and
 c. a spring-urged elongated arch having a convex surface and a concave surface, said arch further having two legs, each of said two legs being placed at an opposite end of the concave surface and angled inward of said arch, whereby the two legs can slide into the two apertures when the convex surface is depressed, whereby the two legs can clamp the peripheral electronic component within the two apertures when the convex surface is not depressed for coupling the rail to the peripheral electronic component.

3. The apparatus, as claimed in claim 2, wherein the apparatus further includes a conduction means for electrically coupling the chassis of the peripheral electronic component to the ground of the electronic system.

4. An apparatus for rack mounting a peripheral electronic component to an electronic system, said peripheral electronic component having a chassis and at least two threaded apertures, said electronic system having a ground, said apparatus comprising:

a. a carrier; and
 b. a spring-urged elongated arch having a convex surface and a concave surface, said arch further having two legs, each of said two legs being placed at an opposite end of the concave surface and angled inward of said arch, whereby the two legs can slide into the two apertures when the convex surface is depressed, whereby the two legs can clamp the peripheral electronic component within the two apertures when the convex surface is not depressed for coupling the carrier to the peripheral electronic component.

5. The apparatus, as claimed in claim 4, wherein the apparatus further includes a conduction means for electrically coupling the chassis of the peripheral electronic component to the ground of the electronic system.

6. An improved method for mounting an independent rail means to a peripheral electronic component, said independent rail means having at least two first apertures, said peripheral electronic component having at least two second apertures, said improved method comprising the steps of:

a. engaging a spring-urged elongated arch having a convex surface and a concave surface by depressing the convex surface, said arch further having two legs, each of said legs being placed at an opposite end of the concave surface and angled inward of said arch;

b. directing the two legs individually through two of the first apertures;

c. directing the two legs individually into two of the second apertures; and d. disengaging said arch by releasing said convex surface, wherein the two legs retract and clamp the peripheral electronic component within the two second apertures.

* * * * *

UNITED STATES PATENT AND TRADEMARK OFFICE
CERTIFICATE OF CORRECTION

PATENT NO.   :   5,587,889

DATED        :   December 24, 1996

INVENTOR(S)  :   Jim Sacherman

It is certified that error appears in the above-identified patent and that said Letters Patent is hereby correct as shown below:

On title page, insert item [73] to read, as follows:

Assignee:   Palo Alto Design Group
                  Palo Alto, California

Signed and Sealed this

Twenty-ninth Day of December, 1998

Attest:

BRUCE LEHMAN

*Attesting Officer*        *Commissioner of Patents and Trademarks*